(12) United States Patent
Chalco et al.

(10) Patent No.: US 6,444,562 B1
(45) Date of Patent: Sep. 3, 2002

(54) NICKEL ALLOY FILMS FOR REDUCED INTERMETALLIC FORMATION IN SOLDER

(75) Inventors: Pedro Armengo Chalco, Yorktown; Edmund David Blackshear, Wappingers Falls, both of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/641,413

(22) Filed: Aug. 18, 2000

Related U.S. Application Data

(62) Division of application No. 09/365,683, filed on Aug. 2, 1999, now Pat. No. 6,130,479.

(51) Int. Cl.$^7$ ............................................. H01L 21/44
(52) U.S. Cl. ........................ 438/613; 438/614; 438/615
(58) Field of Search ............................... 438/613, 614, 438/615

(56) References Cited

U.S. PATENT DOCUMENTS

| | | | | |
|---|---|---|---|---|
| 4,679,311 A | * | 7/1987 | Lakhani et al. | 148/DIG. 143 |
| 5,179,041 A | * | 1/1993 | Yano et al. | 438/605 |
| 5,327,013 A | | 7/1994 | Moore et al. | 257/772 |
| 5,525,204 A | | 6/1996 | Shurboff et al. | 205/125 |
| 5,670,418 A | | 9/1997 | Ghosal | 438/613 |
| 5,726,501 A | * | 3/1998 | Matsubara | 257/778 |
| 5,730,853 A | | 3/1998 | Smith et al. | 205/210 |
| 5,849,170 A | | 12/1998 | Djokic et al. | 205/163 |
| 5,869,904 A | | 2/1999 | Shoji | 297/779 |
| 5,936,848 A | | 8/1999 | Mehr et al. | 361/777 |
| 6,005,466 A | * | 12/1999 | Pedder | 336/200 |

OTHER PUBLICATIONS

K.W. Asai et al., "Improvement of Nickel Films For Diffusion Barrier," IBM Technical Disclosure Bulletin, Mar. 1976, p. 3499.
J.F. Sullivan, "Metallurgical System for Gold to Tin or Solder Contacts," Research Disclosure No. 273, Jan. 1987.
P. Madakson, "Effective Diffusion Barrier for Metallic Thin Films," IBM Technical Disclosure Bulletin, Nov. 1991, p. 175.
A. Gohda et al., "Low Cost Process of Wafer Bump Fabrication," IBM Technical Disclosure Bulletin, Mar. 1996, p. 169.

* cited by examiner

*Primary Examiner*—Trung Dang
*Assistant Examiner*—William M. Brewster
(74) *Attorney, Agent, or Firm*—Jay H. Anderson

(57) ABSTRACT

A method is provided for forming a solder joint to a pad, in which the thickness of the intermetallic layer formed by nickel in contact with solder is significantly reduced. A first layer of nickel is provided on the pad; a second layer of a noble metal (preferably gold) is then provided overlying the first layer. The first layer and the second layer are then annealed, thereby forming an alloy layer including nickel and the noble metal between the first layer and the second layer. Contacting the second layer with a molten solder (where the solder includes tin) then causes the noble metal to dissolve in the solder and the solder to subsequently wet the alloy layer, forming an intermetallic layer including nickel, the noble metal and tin. Only a thin intermetallic film grows, thus improving the reliability of the solder joint.

7 Claims, 2 Drawing Sheets

NICKEL ALLOY FILMS FOR REDUCED INTERMETALLIC FORMATION IN SOLDER

This application is a division of application Ser. No. 09/365,683, filed Aug. 2, 1999, now U.S. Pat. No. 6,130,479.

FIELD OF THE INVENTION

This invention relates to a method for minimizing the formation of intermetallic compounds in solder joints used in making electrical interconnections in electronic packaging of semiconductor devices.

BACKGROUND OF THE INVENTION

In electronic packaging there is an industry-wide problem caused by the tendency of solder joints to form intermetallic compounds with the nickel layer typically used to cover the pads to which the solder adheres. Intermetallic compounds are brittle materials that are sources of microcracks and also serve as paths for crack propagation that lead to the premature failure of solder interconnections. This is a serious reliability issue that limits the growth of the emerging BGA (Ball Grid Array) and CSP (Chip Scale packaging) technologies which are currently considered to be vital to the continued growth of the semiconductor industry. For this reason the reduction of intermetallic growth in solder joints is the subject of substantial R&D efforts. The current approach to minimize intermetallic growth is to place limitations on the degree of thermal exposure of the solder joints. These limitations are often found to be inadequate, as aggressive thermal excursions such as in the solder reflow process cannot be avoided.

In a typical solder joint the solder material wets two pads to make the interconnection. Pads are typically I/O sites in the circuit layout of either chips or printed circuit boards. In the case of the chips the metal used in the circuitry is aluminum, while in the case of pCBs it is copper. New chip metallization technologies are now replacing aluminum with copper. A solder-wetting layer must cover the surface of the pad. Upon melting, the solder adheres to this layer and forms a strong bond, which is necessary to achieve high reliability. Since solder does not adhere to aluminum, and copper oxidizes easily, the pads require a solder-wetting layer that will insure reliable solder bonds. There are a limited number of metals with reliable and consistent solder-wetting properties. The most common metal, used almost universally in the electronics industry, is nickel covered with a thin layer of gold. Gold over copper cannot be used because copper diffuses easily through gold and forms an oxide layer. Accordingly, a conventional copper pad, shown in FIG. 1A on a substrate 1, has a layer of nickel 11 over the copper pad 10, with a layer of gold 12 covering the nickel.

Nickel has a strong tendency to form intermetallic compounds with tin. The leading solder materials used in the electronics industry contain tin. When the solder melts during the reflow operation to form a connection or solder joint (as shown in FIG. 1B), the protective gold film is dissolved in the molten solder almost instantly. The gold is sometimes referred to as the "sacrificial noble metal." palladium and platinum may also be used for this protective film. Following the gold dissolution, the solder 15 comes into intimate contact with the nickel layer 11, and formation of a nickel/tin intermetallic layer 14 begins, following a short period of nucleation and growth. Formation of a thin intermetallic layer (preferably less than 1 micron thick) has been found to be necessary to achieve a strong solder bond. However, a further increase in thickness compromises the reliability of the solder joints, especially when relatively small volumes of solder are used such as in flip chip and BGA applications.

Intermetallic growth requires significant mobility of nickel atoms through the intermetallic layer to meet and react with tin to form the intermetallic compound. As the thickness of the intermetallic layer increases, its rate of growth diminishes as a parabolic function of time, due to the increase in the length of the path through which the atoms must diffuse. However, this decrease in growth rate occurs after the intermetallic is relatively thick (several microns).

The conventional approach to limiting growth of the intermetallic layer is to limit the thermal exposure of the solder joint. This is not practical in most applications since the solder has to undergo multiple reflow operations and thermal cycling due to power dissipation on the chip.

In addition, the present inventors have observed that the use of pure metals to make contact with the solder does not provide an effective environment to reduce intermetallic formation. Intermetallic formation and its growth are known to be governed by diffusion of nickel atoms forming the intermetallics. It is generally known that pure nickel is a good solder-wettable material and that it produces relatively thick intermetallic layers when in contact with solder. As noted above, it is desirable to form an intermetallic layer less than 1 micron thick. Accordingly, it is desirable to form an effective diffusion barrier for nickel atoms that slows down the rate of intermetallic growth, so that only a thin intermetallic layer is formed.

SUMMARY OF THE INVENTION

The present invention addresses the above-described need for a reduced-thickness intermetallic layer when a solder joint to a pad is formed.

In accordance with the present invention, a method is provided for forming a solder joint to a pad, in which the thickness of the intermetallic layer formed by nickel in contact with solder is significantly reduced. This method includes the steps of providing a first layer of nickel on the pad; providing a second layer of a noble metal (preferably gold) overlying the first layer; and annealing the first layer and the second layer, thereby forming an alloy layer including nickel and the noble metal between the first layer and the second layer. Contacting the second layer with a molten solder (where the solder includes tin) then causes the noble metal to dissolve in the solder and the solder to subsequently wet the alloy layer, to form an intermetallic layer including nickel, the noble metal and tin.

This method can realize important advantages. Most important, it decreases significantly the rate of formation of intermetallics, thus improving the mechanical reliability of the solder joint. This method also eliminates the thermal-exposure constraints currently imposed on solder reflow operations.

According to another aspect of the invention, a method is provided for forming a solder joint to a pad, in which an alloy layer is deposited on the pad; the alloy includes nickel and an alloying element selected from the group consisting of gold, palladium and platinum. A layer of gold is then deposited on the alloy layer to form a nickel-alloy/gold structure on the pad. Contacting this structure with a molten solder (where the solder includes tin) then causes the gold to dissolve in the solder and the solder to subsequently wet the alloy layer, to form an intermetallic layer including nickel, gold and tin. The nickel alloy layer and the gold layer may be deposited by plating methods.

According to a further aspect of the invention, a solder joint structure is provided, in which solder including tin is connected to a pad. This solder joint structure includes a layer of nickel disposed on the pad and an alloy layer overlying the nickel layer. The alloy layer includes nickel and an alloying element selected from the group consisting of gold, palladium and platinum. The structure also includes an intermetallic layer between the solder and the alloy layer, the intermetallic layer including nickel, the alloying element and tin; the intermetallic layer is formed by the solder wetting the alloy layer. The alloy layer may be formed by annealing a layer of nickel and a layer of the alloying element.

According to an additional aspect of the invention, a solder joint structure is provided which includes an alloy layer disposed on the pad and an intermetallic layer between the solder and the alloy layer. The alloy layer may be deposited on the pad by plating. The alloy includes nickel and an alloying element selected from the group consisting of gold, palladium and platinum; the intermetallic layer includes nickel, the alloying element and tin, and is formed by the solder wetting the alloy layer.

DETAILED DESCRIPTION OF THE PREFERRED EMBODIMENTS

The present inventors have conducted studies showing that annealing (which also may be characterized as aging or heat treatment) of the Cu—Ni—Au metallurgy prior to soldering significantly reduces the intermetallic formation rate, to the point where at 1000×magnification it is barely detectable after a 10 second solder dip. This suggests that during aging a nickel-gold alloy forms at a rate which is dependent on temperature and time.

Figure 1A:
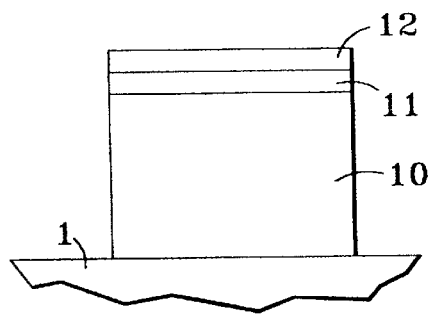
FIG. 1A is a schematic illustration of a pad with a conventional Cu—Ni—Au structure.
Figure 1B:
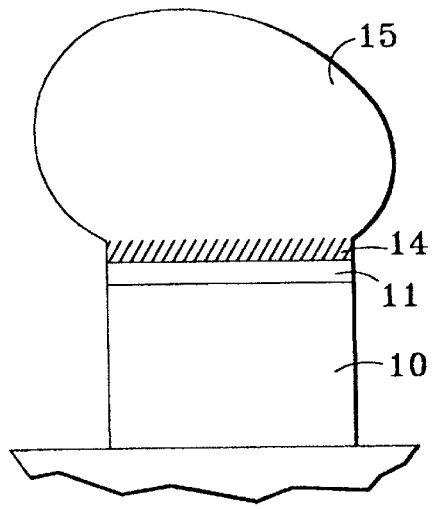
FIG. 1B shows the pad of FIG. 1A with a solder joint formed after a solder reflow process, and illustrates schematically the formation of a thick intermetallic layer.
Figure 2A:
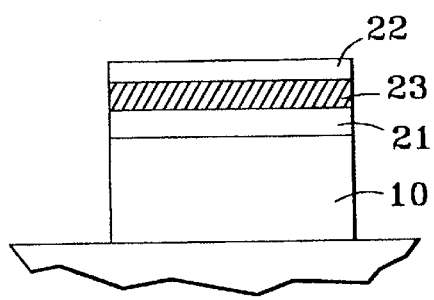
FIG. 2A shows a pad structure having layers of nickel, a nickel alloy formed by annealing, and gold over copper, in accordance with the preferred embodiment of the invention.

A preferred embodiment of the invention is shown in FIG. 2A. Before annealing, the pad structure is the same as in FIG. 1A, with a layer of gold 12 over a layer of nickel 11, on top of the copper pad 10. The annealing process causes interdiffusion of the gold and the nickel, resulting in formation of a graded Ni—Au alloy layer 23 between layers of gold 22 and nickel 21. The thickness of the alloy layer is less than the combined original thickness of the Ni and Au layers. It should be noted that a thin layer 22 of gold remains on top of the structure after annealing; this layer serves to protect the alloy layer.

It has been found that annealing for 3 weeks at 125° C. resulted in formation of an alloy layer as shown in FIG. 2A.

Furthermore, based on known diffusion characteristics, it will be appreciated that the following sets of annealing conditions are equivalent:

| | |
|---|---|
| 125° C. | 3 weeks |
| 225° C. | 2 days |
| 275° C. | 16 hours |
| 325° C. | 5 hours |
| 375° C. | 2 hours |

Accordingly, a structure as shown in FIG. 2A can be realized using a 2-hour annealing process at 375° C.

Figure 2B:
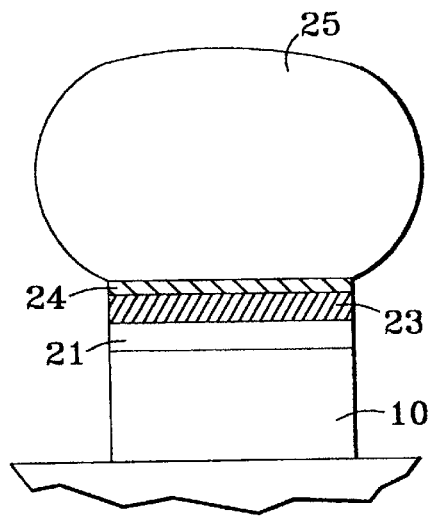
FIG. 2B illustrates schematically a reaction barrier effect, leading to the formation of a thin intermetallic layer, in a solder reflow process when the structure of FIG. 2A is used.

In the solder reflow process, the gold layer 22 dissolves in the solder 25, thus allowing the solder to wet the nickel alloy layer 23. Immediately thereafter, the nickel alloy reacts with the solder to form a thin intermetallic layer 24 whose composition includes nickel, tin and gold (see FIG. 2B). Further growth of the intermetallic layer requires diffusion of nickel through the intermetallic layer 24. This is made difficult by the presence of the alloying element (in this case, gold) in the intermetallic. The intermetallic layer thus serves as a reaction barrier; the result is a reduction in the intermetallic growth rate. The intermetallic layer 24 has a thickness of less than 1 micron. As noted above, this is desirable to obtain a strong solder bond to the pad.

Figure 3A:
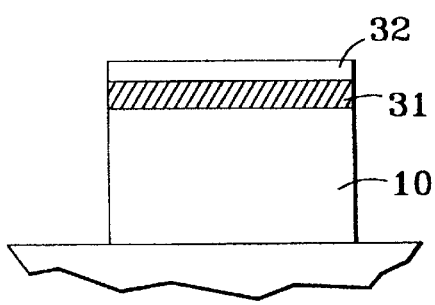
FIG. 3A shows a pad structure having a nickel alloy layer and a gold layer formed on the copper pad by plating, in accordance with an alternative embodiment of the invention.
Figure 3B:
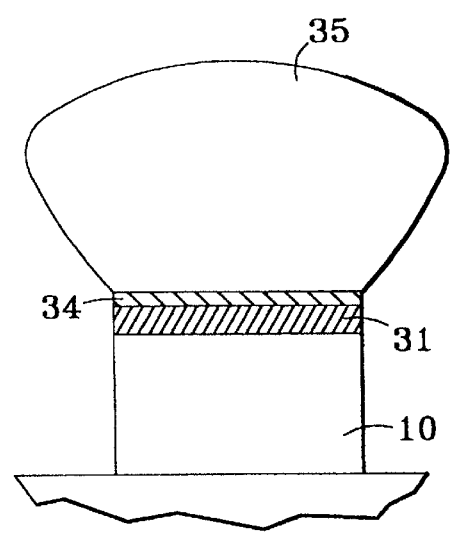
FIG. 3B shows formation of a thin intermetallic layer in a solder reflow process when the structure of FIG. 3A is used.

Alternatively, a nickel-alloy/gold structure may be obtained by plating on the copper pad (see FIG. 3A). A nickel alloy layer 31 is plated over the copper pad 10 using conventional plating methods. Previous to plating, the copper pad is prepared with cleaning solutions to insure good adhesion of the plated layer. The next step is to plate the nickel alloy layer 31 using a conventional plating solution, followed by plating a layer of gold 32 to protect the surface of the nickel alloy layer 31. The preferred alloy to be used in layer 31 is nickel-gold. Since gold has an atomic size that is close to that of nickel, a mixture of both elements forms a solid solution with a uniform face-centered crystal structure. Other possible alloys include nickel-palladium and nickel-platinum. The preferred alloy composition includes the range of 1% to 50% (atomic percent) of the alloying element. Ternary alloys, combining nickel with two elements which can be gold, palladium, or platinum, may also be used. This structure forms a thin intermetallic layer as a result of the solder reflow process, as shown in FIG. 3B. The thin gold layer 32 is dissolved in the solder 35, and the solder subsequently wets the alloy layer 31. This results in formation of intermetallic layer 34 between the solder and the alloy layer.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

We claim:

1. A method of forming a solder joint to a pad, comprising the steps of:
   providing a first layer of nickel on the pad;
   providing a second layer of a noble metal overlying the first layer;

annealing the first layer and the second layer, thereby forming an alloy layer including nickel and the noble metal between the first layer and the second layer; and contacting the second layer with a molten solder including tin, thereby causing the noble metal to dissolve in the solder and the solder to subsequently wet the alloy layer, to form an intermetallic layer including nickel, the noble metal and tin between the alloy layer and the solder.

2. A method according to claim 1, wherein the noble metal is selected from the group consisting of gold, palladium and platinum.

3. A method according to claim 1, wherein said annealing step is performed at a temperature not greater than 375° C.

4. A method according to claim 1, wherein said contacting step includes a solder reflow process.

5. A method of forming a solder joint to a pad, comprising the steps of:

cleaning the pad with cleaning solutions;

plating an alloy layer on the pad, the alloy including nickel and an alloying element selected from the group consisting of gold, palladium and platinum;

plating a layer of gold on the alloy layer to form a nickel-alloy/gold structure on the pad; and contacting the nickel-alloy/gold structure with a molten solder including tin, thereby causing the gold to dissolve in the solder and the solder to subsequently wet the alloy layer, to form an intermetallic layer including nickel, gold and tin between the alloy layer and the solder.

6. A method according to claim 5, wherein the alloy is a ternary alloy including nickel and two elements selected from the group consisting of gold, palladium and platinum.

7. A method according to claim 5, wherein the alloying element comprises 1 atomic % to 50 atomic % of the alloy.

\* \* \* \* \*